United States Patent [19]

Hida

[11] Patent Number: 5,448,086
[45] Date of Patent: Sep. 5, 1995

[54] FIELD EFFECT TRANSISTOR

[75] Inventor: Hikaru Hida, Tokyo, Japan

[73] Assignee: NEC Corporation, Tokyo, Japan

[21] Appl. No.: 252,253

[22] Filed: Jun. 1, 1994

[30] Foreign Application Priority Data

Jun. 1, 1993 [JP] Japan .................. 5-130466

[51] Int. Cl.6 .................... H01L 27/02
[52] U.S. Cl. ................. 257/194; 257/280
[58] Field of Search ................. 257/194, 280

[56] References Cited

FOREIGN PATENT DOCUMENTS 62-230063  10/1987  Japan .
0220029    1/1990  Japan .................. 257/194

OTHER PUBLICATIONS

By P. Solomon et al., "Low Resistance Ohmic Contacts to two-dimensional electron-gas structures by selective MOVPE", IEEE, 1989, pp. 405-408.

Primary Examiner—Mark V. Prenty
Attorney, Agent, or Firm—Young & Thompson

[57] ABSTRACT

A field effect transistor comprises a semiconductor substrate, a first layer made of a semiconductor having an electron affinity and the first layer being formed on the semiconductor substrate, a second layer made of material having electron affinity smaller than that of the first layer formed on the first layer, a length of the second layer being longer than that of the first layer, source and drain regions formed on the semiconductor substrate, the source and drain regions being separated through a lamination of the first and second layer, a gate electrode formed on the second layer, a gate length of the gate electrode being shorter than that of the second layer and being shorter than that of the first layer and the gate electrode being separated from the source and drains region through the second layer.

4 Claims, 14 Drawing Sheets

FIELD EFFECT TRANSISTOR

BACKGROUND OF THE INVENTION

This invention relates to a semiconductor transistor, and more particularly to a field effect transistor (FET) having a low parasitic resistance with a high breakdown voltage.

Recently, high-frequency and high speed FETs using compound semiconductors such as GaAs have actively been researched and developed for LSIs with a high speed performance and a low power consumption. The FET devices are required to have not only a high breakdown voltage property but also a low parasitic resistance. The breakdown voltage is an important factor for keeping a reliability in the device performance. A parasitic resistance in a parasitic region under a gate electrode of the FET is also a vary important factor for the device performances. A high parasitic resistance may impede the FET device and LSIs to have high frequency and high speed performances. It is, therefore, required to reduce a parasitic resistance as large as possible for obtaining ideal high speed and high frequency performance.

In the prior arts to reduce the parasitic resistance, the devices such as the FETs are fabricated by a selective ion-implantation method and an spitaxial growth method. The Japanese laid open patent application No. 62-230063 describes providing source and drain regions in the vicinity of a gate electrode for reducing parasitic resistances of source and drain region.

FIG. 1 is a cross sectional view illustrative of the above FET. This FET comprises a semi-insulated GaAs substrate 1, a channel layer 2 made of an undoped GaAs formed on the substrate 1, an electron supply layer 3 made of an n-type AlGaAs formed on the channel layer 2, a gate electrode 4 formed on the electron supply layer 3 and an electrode forming region 7 for source and drain electrodes 5 and 6.

The FET having the above structure may be fabricated by the following steps. Referring to FIG. 2A, the channel layer 2, the electron supply layer 3 and a p-type GaAs layer 8 are sequentially formed on the substrate 1. Referring to FIG. 2B, the gate electrode 4 is then formed on the p-type GaAs layer 8. Subsequently, the p-type GaAs layer 8 is selectively etched by using the gate electrode 4 as a mask to form a p-n type control electrode 8'. Referring to FIG. 2C, an insulating film 9 made of SiO₂ is formed at opposite sidewalls of the etched p-type GaAs layer 8. The electron supply layer 3 is selectively etched by using the p-type GaAs layer 8 and the insulating film 9 used as masks. Referring to FIG. 2D, an n-type GaAs is grown at the etched portion by an spitaxial growth method to form the electrode forming region 7 for the source and the drain electrodes 5 and 6.

According to the foregoing prior arts, the electrode forming region 7 made of the n-type GaAs may be formed by the opposite sides of the gate electrode without any heat treatment to secure a high mobility of electrons confined in the channel layer so as to a two-dimensional electron gas (2DEG).

The prior art device would, however, be engaged with a disadvantage in a poor breakdown voltage and in a difficulty to reduce the parasitic resistance. In so far as the electron supply layer was formed to have the same length as that of the channel layer which is required to have the same length as the gate length of the gate electrode, it would be difficult to obtain both a high breakdown voltage and a possible reduction of parasitic resistance.

SUMMARY OF THE INVENTION

It is an object of the invention to provide a FET which has not only a high breakdown voltage but also a sufficient low parasitic resistance.

The above and other objects, features, and advantages of the present invention will be apparent from the following descriptions.

In accordance with the invention, there is provided a field effect transistor comprising a semiconductor substrate, a first layer made of a semiconductor having an electron affinity formed on the semiconductor substrate, a second layer made of a material having an electron affinity smaller than that of the first layer formed on the first layer, a length of the second layer being longer than that of the first layer, source and drain regions formed on the semiconductor substrate, the source and drain regions being separated through a lamination of the first and second layer and a gate electrode formed on the second layers, a gate length of the gate electrode being shorter than that of the second layer and being shorter than that of the first layer and the gate electrode being separated from the source and drains region through the second layer.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

A first embodiment according to the invention will be described below.

Figure 1:
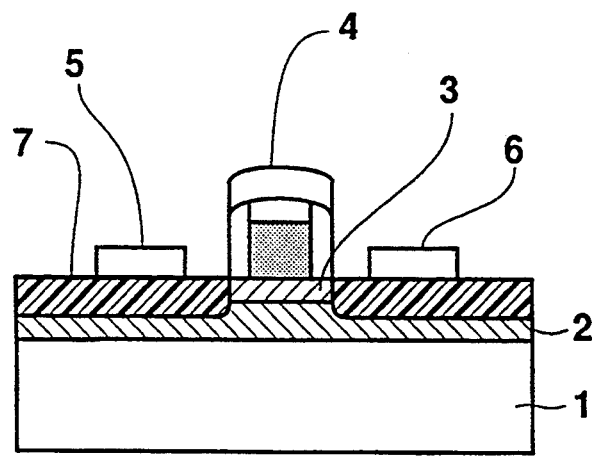
FIG. 1 is a cross sectional view showing the conventional FET.
Figure 2A:
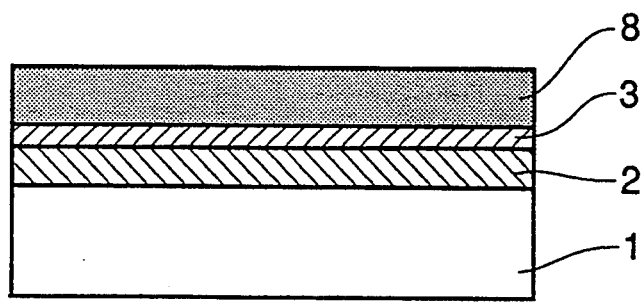
FIGS. 2A through 2D are cross sectional views showing sequential steps of the conventional method for making the FET of FIG. 1.
Figure 2B:
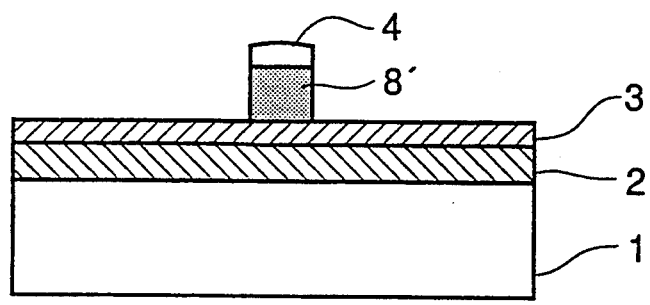
Figure 2C:
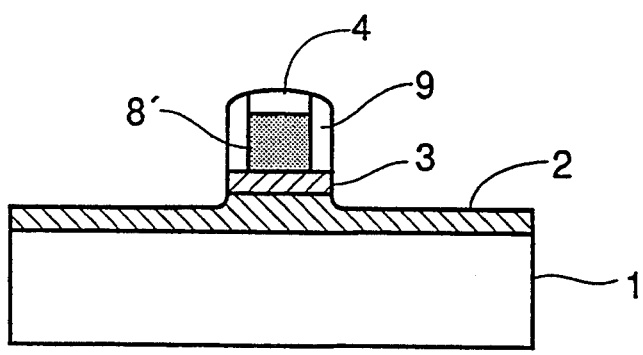
Figure 2D:
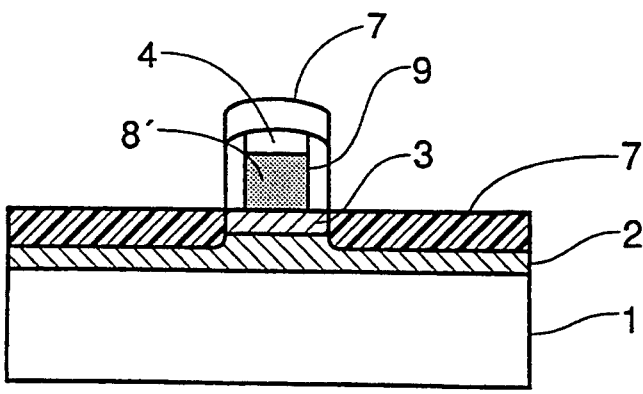
Figure 3:
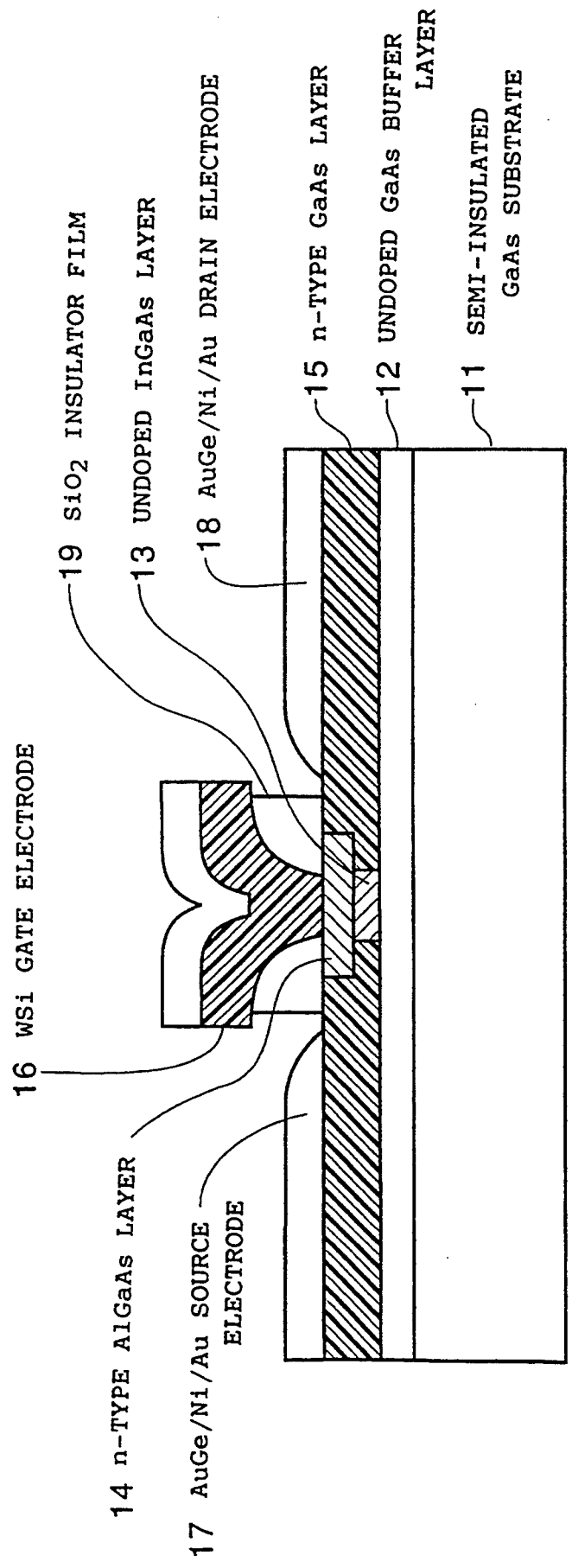
FIG. 3 is a cross sectional view showing a FET of a first embodiment according to the invention.

In FIG. 3, a FET comprises a semi-insulated GaAs substrate 11, an undoped GaAs buffer layer 12 having a thickness of approximately 500 nm formed on the substrate 11, an undoped InGaAs layer 13 having a thickness of approximately 15 nm formed on the buffer layer 12, an n-type AlGaAs layer 14 having a thickness of approximately 25 nm with an impurity concentration of approximately $3 \times 10^{18}$ cm$^{-3}$ formed on the undoped GaAs layer 13, an n-type GaAs layer 15 having a thickness of approximately 100 nm with an impurity concentration of approximately $4 \times 10^{18}$ cm$^{-3}$ formed on the buffer layer 12 and surrounding both the undoped GaAs layer 13 and the n-type AlGaAs layer 14, a gate electrode 16 made of WSi formed on the AlGaAs layer 14, source and drain electrodes 17 and 18 comprising AuGe/Ni/Au formed on the source and drain regions and an insulator film 19 made of SiO$_2$ formed to surround a lower part of the gate electrode 16.

In the structure of the above FET, a gate length is approximately 0.3 μm and both distances between the gate and the source and between the gate and the drain are approximately 0.1 μm. Further, a length of the n-type AlGaAs layer 14 is at least longer than a gate length. A length of the undoped InGaAs layer 13 is equal to or longer than the gate length. The length of the n-type AlGaAs layer 14 is longer than that of the undoped InGaAs layer 13.

Furthermore, the length of the undoped InGaAs layer 13 is variable in the range of from 10 nm to 0.1 μm. The thickness of it 13 is variable in the range of from 1 nm to 500 nm. The n-type AlGaAs layer 14 extends from the opposite ends of the gate electrode in a horizontal direction. The length of the each extending portion is variable in the range of from 10 nm to 1 μm and the thickness of it is variable in the rang of from 1 nm to 500 nm. The length of the gate electrode 16 is variable in the range of from 10 nm to 0.1 μm.

Figure 4A:
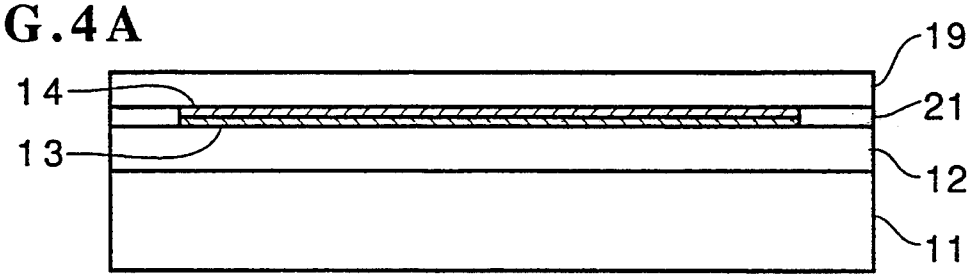
FIGS. 4A through 4H are cross sectional views showing sequential steps of a method for making a FET of FIG. 3 in a the first embodiment according to the invention.

The FET of the first embodiment may be fabricated by the following steps. Referring to FIG. 4A, the undoped GaAs layer 12, the undoped InGaAs layer 13 and the n-type AlGaAs layer 14 are sequentially grown on the semi-insulated GaAs substrate 11 by use of a molecular beam epitaxy (MBE) method. Then, a photoresist is partially applied on the n-type AlGaAs layer 14 to form a photoresist mask. Boron is implanted by an ion implantation to form an isolation region 21. Further, SiO$_2$ 19 having a thickness of approximately 300 nm is deposited on the surface of the n-type AlGaAs layer 14.

Figure 4B:
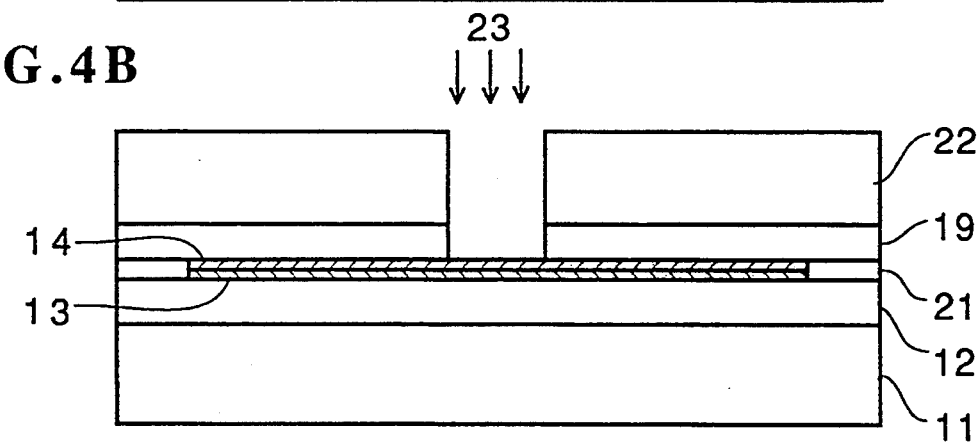

Referring to FIG. 4B, a photoresist pattern 22 is made by use of an optical exposure method, and then SiO$_2$ 19 is etched by a dry etching using CF$_4$ gas 23 to form an opening having a diameter of approximately 0.5 μm.

Figure 4C:
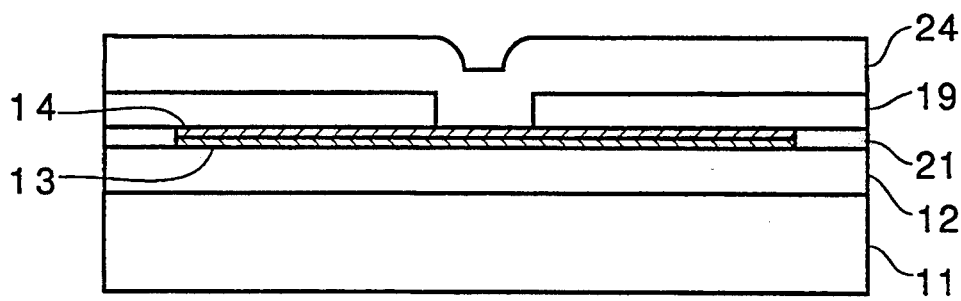

Referring to FIG. 4C, the photoresist pattern 22 is removed and SiON 24 having a thickness of approximately 150 nm is deposited on the SiO$_2$ 19 and in the opening by a plasma CVD method.

Figure 4D:
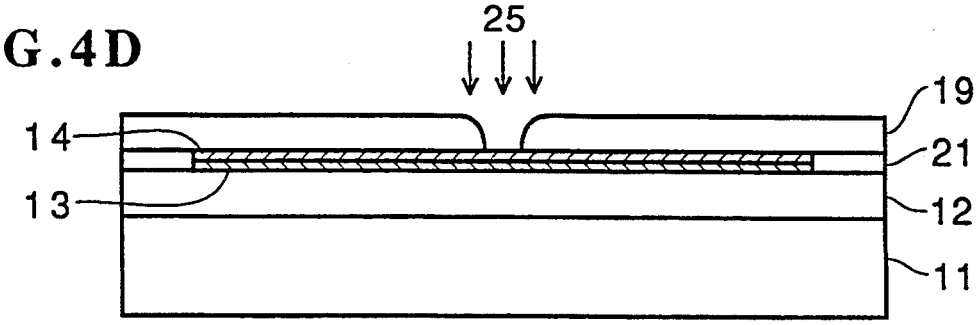

Referring to FIG. 4D, the SiON 24 is made by an anisotropic etching with use of a mixed gas of CF$_4$ and SF$_6$ 25 to form sidewalls made of the SiON 24 having a thickness of approximately 100 nm.

Figure 4E:
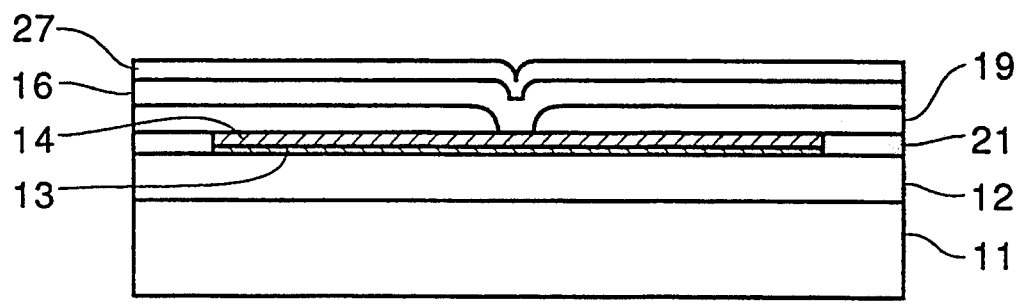

Referring to FIG. 4E, WSi 26 to be used as the gate electrode is deposited by sputtering and then SiO$_2$ 27 having a thickness of approximately 150 nm is deposited by a thermal heat CVD method.

Figure 4F:
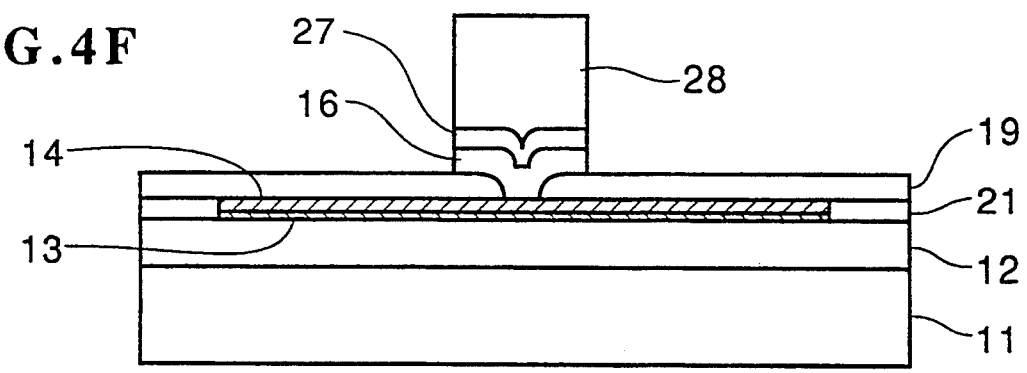

Referring to FIG. 4F, the gate electrode is subjected to patterning by a photoresist mask 28. The SiO$_2$ 27 and the WSi 26 are etched by a dry etching with CF$_4$ and SF$_6$. The photoresist mask 28 is removed and then another photoresist mask also provided. The SiO$_2$ 19 is etched by the dry etching method with CF$_4$ to form an opening and the photoresist 28 is also removed.

Figure 4G:
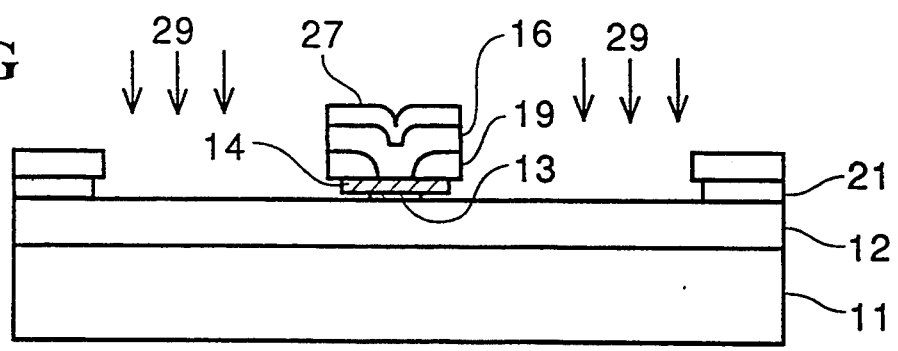

Referring to FIG. 4G, the AlGaAs layer 14 is selectively etched by use of Cl$_2$ gas 29 to permit the length of the AlGaAs layer 14 to be longer than the gate length. Then, the InGaAs layer 13 is etched by use of a mixed aqueous solution of a succini acid, an aqueous hydrogen peroxide and an ammonium of hydroxide so that the length of the InGaAs layer 13 is equal to or longer than the gate length and less than that of the AlGaAs layer 14.

Figure 4H:
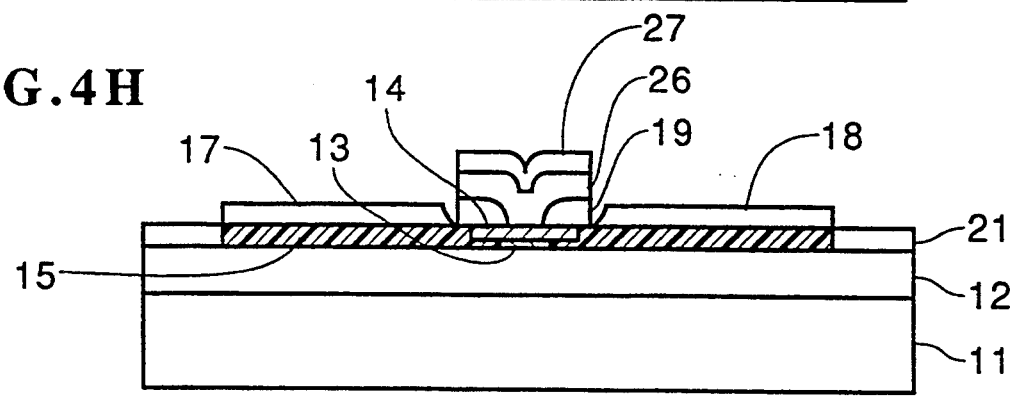

Referring to FIG. 4H, the n-type GaAs layer 15 is selectively grown in the opening by use of a metal organic molecular beam epitaxy (MOMBE) method and subsequent lift-off method. AuGe/Ni/Au is provided by a vacuum-evaporation on the n-type GaAs layer 15 and then allowed to form the source and drain electrodes 17 and 18 serving as ohmic electrodes.

In operation, a reverse voltage is applied to the gate electrode 16 to control a current flowing through a channel region formed in the undoped InGaAs layer 13 so as to control a drain current.

In the FET, the substrate 11 is made by a semi-insulated material to prevent any electrical current to flow. The buffer layer 12 is to obtain a smooth interface with the channel layer- The undoped InGaAs layer 13 is used as a channel layer and the n-type AlGaAs layer 14 is used as an electron supply layer. It is important that an electron affinity of the n-type AlGaAs layer 14 is shorter than that of the undoped InGaAs layer 13 so that the layer 14 may roll as a potential barrier to carriers or electrons to permit almost all of the current to pass through the channel.

Further, in the FET, the n-type GaAs layer 15 which has a low resistance is separated from the gate electrode 16 through the n-type AlGaAs layer 14 so that a high breakdown voltage of the FET is obtained. It is, therefore, required that the n-type AlGaAs layer 14 is at least longer than the gate length. Still further, the undoped InGaAs layer 13 is longer than or equal to the gate length to permit the parasitic resistance to be reduced down equal to or less than 0.1 Ωmm. This provides such a high electron mobility as permitting the FET to possess high speed and frequency performances. As described above, the above two points are the most important features of this embodiment.

Figure 5:
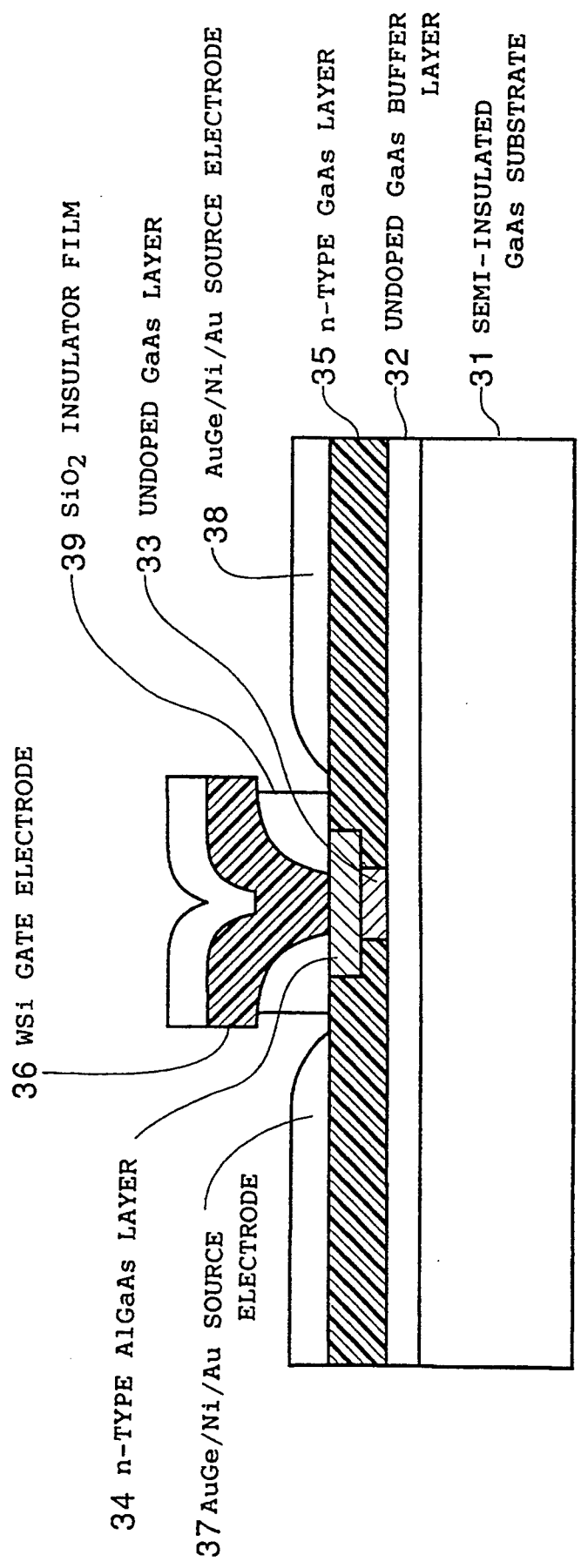
FIG. 5 is a cross sectional view showing a FET in a second embodiment according to the invention.

A second embodiment according to the present invention will be described. In FIG. 5, the FET comprises a semi-insulated GaAs substrate 31, an undoped GaAs buffer layer 32 having a thickness of approximately 500 nm formed on the substrate 31, an undoped GaAs layer 33 having a thickness of approximately 30 nm formed on the buffer layer 32, an n-type AlGaAs layer 34 having a thickness of approximately 35 nm and an impurity concentration of approximately $3 \times 10^{18}$ cm$^{-3}$ formed on the undoped GaAs layer 33, an n-type GaAs layer 35 having a thickness of approximately 100 nm and an impurity concentration of approximately $4 \times 10^{18}$ cm$^{-3}$ formed on the buffer layer 32 and surrounding both the undoped GaAs layer 33 and the n-type AlGaAs layer 33, a gate electrode 36 made of WSi formed on the AlGaAs layer 34, source and drain electrodes 37 and 38 comprising AuGe/Ni/Au formed on the source and drain regions and an insulator film 39 made of SiO$_2$ formed to surround a lower part of the gate electrode 36.

Figure 6A:
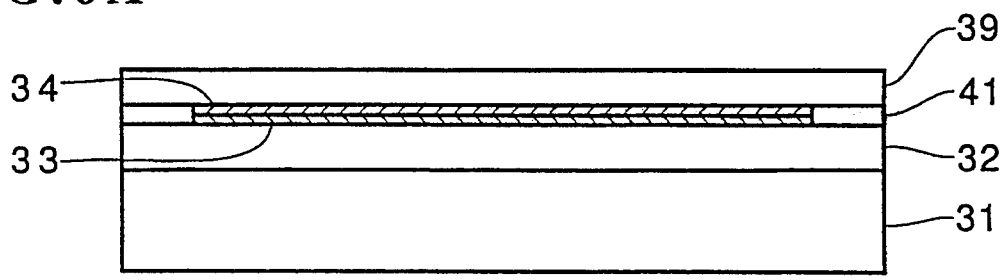
FIGS. 6A through 6H are cross sectional views showing sequential steps of a method for making a FET of FIG. 5.
Figure 6B:
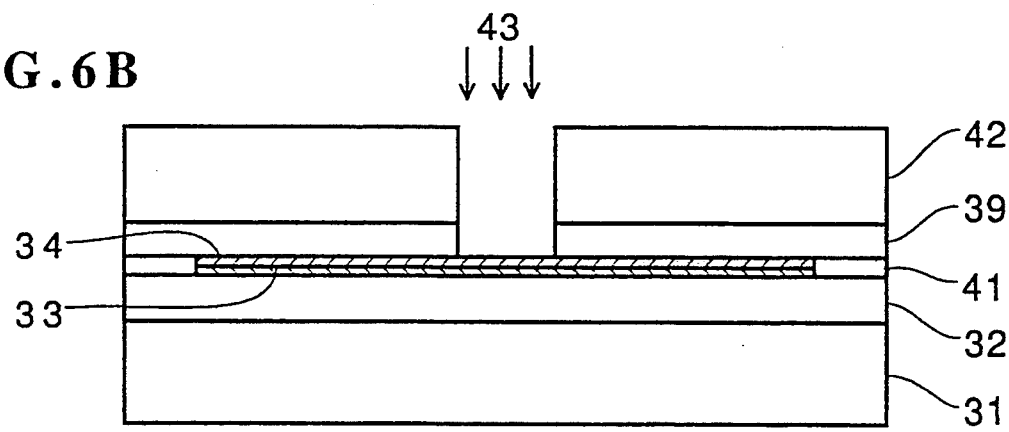
Figure 6C:
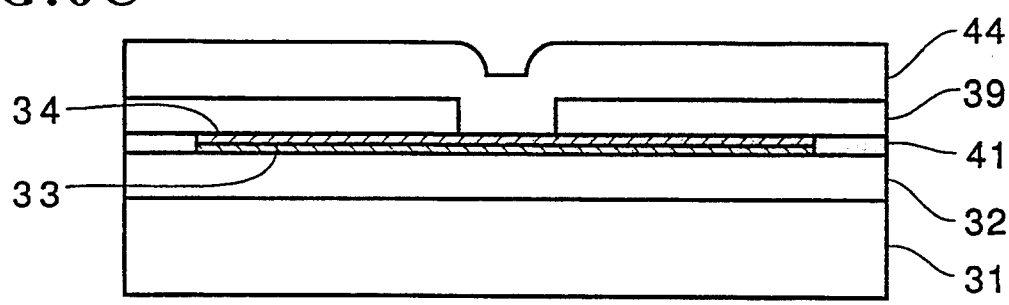
Figure 6D:
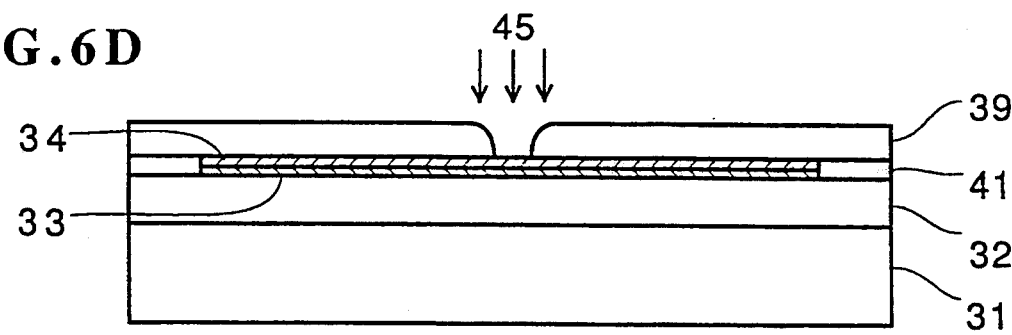
Figure 6E:
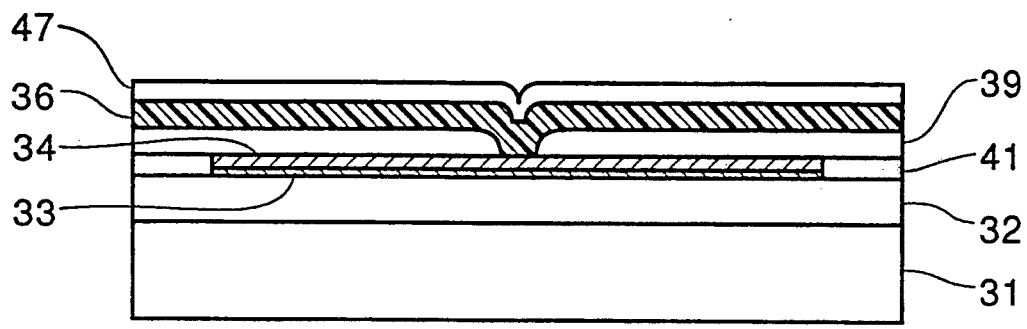
Figure 6F:
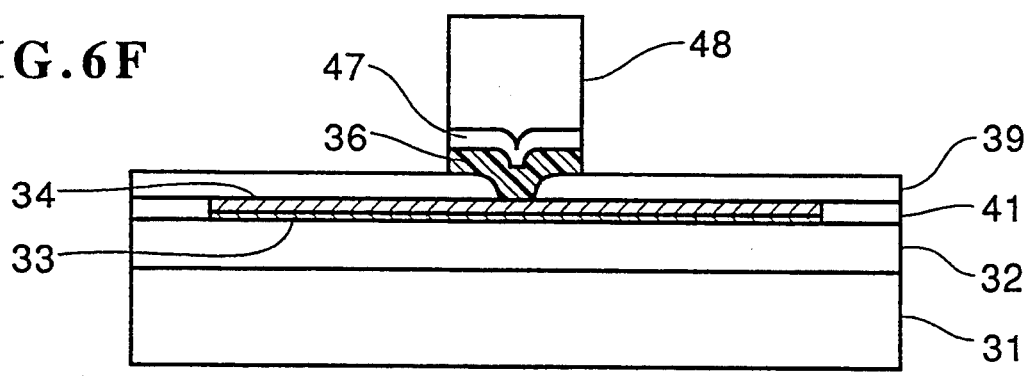

The FET of the second embodiment may be fabricated by the following steps. Referring to FIG. 6A, the undoped GaAs 32, the undoped GaAs layer 33 and the n-type AlGaAs layer 34 are sequentially grown on the semi-insulated GaAs substrate 31 by use of a molecular beam epitaxy (MBE) method. Then, a photoresist is partially applied to form a mask. Boron is implanted by an ion implantation to form an isolation region 41. Further, $SiO_2$ 39 having a thickness of approximately 300 nm is deposited on the surface of the n-type AlGaAs layer 34. Since the following fabrication steps of the FET in the second embodiment are the same as those in the first embodiment, the description of the following fabrication steps will be eliminated.

Figure 6G:
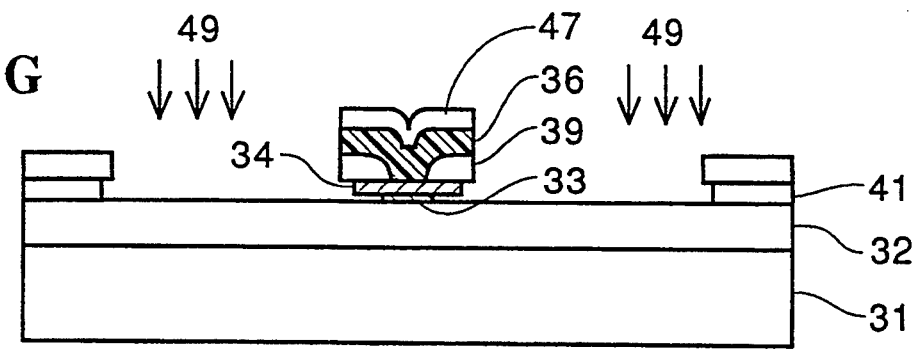

Referring to FIG. 6G, the AlGaAs layer 34 and the GaAs layer 33 are etched by $Cl_2$ gas 49 and then the GaAs layer 33 is selectively etched by use of a mixed gas of $CCl_2F_2$ and He.

Figure 6H:
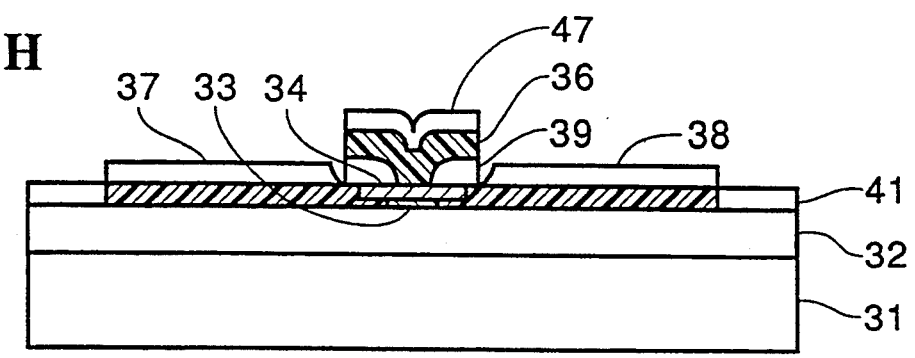

Referring to FIG. 6H, the n-type GaAs layer 35 is selectively grown in an opening by use of a metal organic molecular beam epitaxy (MOMBE) and subsequent use of a lift-off method, AuGe/Ni/Au layer is allowed to form the source and the drain electrodes 37 and 38 serve used as ohmic electrodes.

Figure 7:
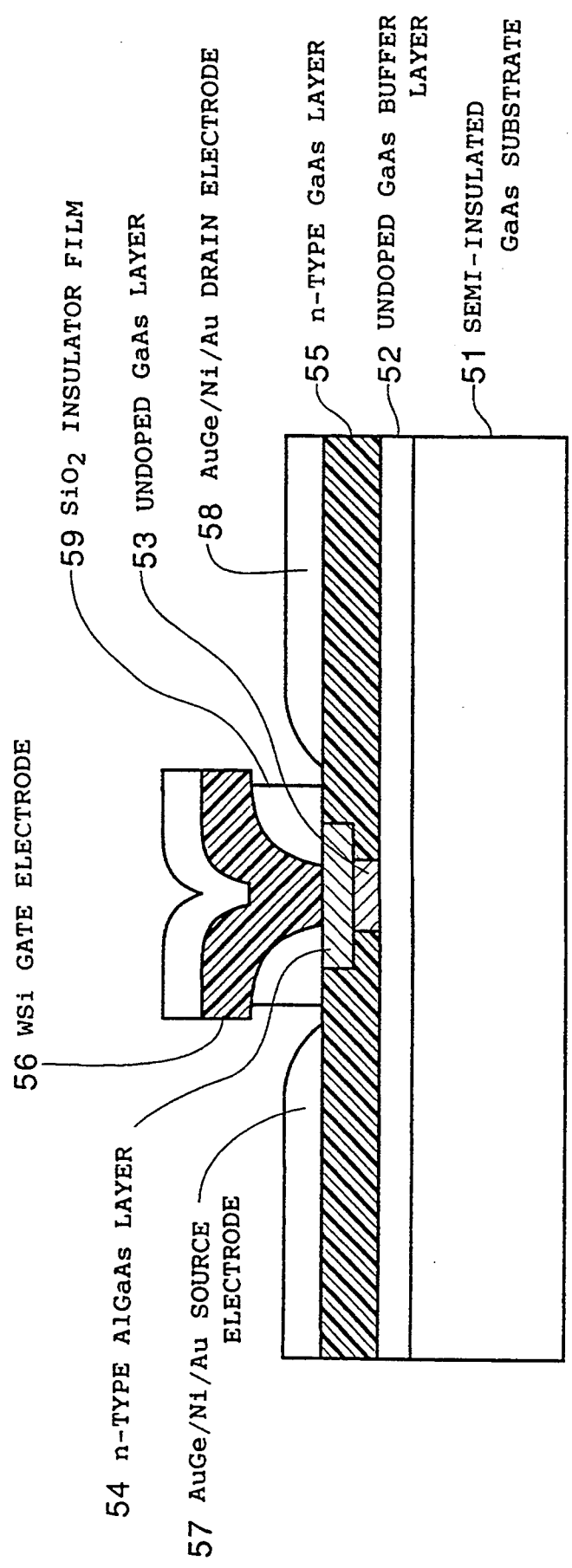
FIG. 7 is a cross sectional view showing a FET in a third embodiment according to the invention.

A third embodiment according to the invention will be described. In FIG. 7, the FET of the third embodiment comprises a semi-insulated GaAs substrate 51, an undoped GaAs buffer layer 52 having a thickness of approximately 500 nm formed on the substrate 51, an undoped GaAs layer 53 having a thickness of approximately 50 nm formed on the buffer layer 52, an n-type AlGaAs layer 54 having a thickness of approximately 40 nm and an impurity concentration of approximately $2 \times 10^{18}$ cm$^{-3}$ formed on the undoped GaAs layer 53, an n-type GaAs layer 55 having a thickness of approximately 100 nm and an impurity concentration of approximately $4 \times 10^{18}$ cm$^{-3}$ formed on the buffer layer 52 and surrounding both the undoped GaAs layer 53 and the n-type AlGaAs layer 54, a gate electrode 56 made of WSi formed on the AlGaAs layer 54, source and drain electrodes 57 and 58 comprising AuGe/Ni/Au formed on the source and drain regions and an insulator film 59 made of $SiO_2$ formed to surround a lower part of the gate electrode 56.

Figure 8:
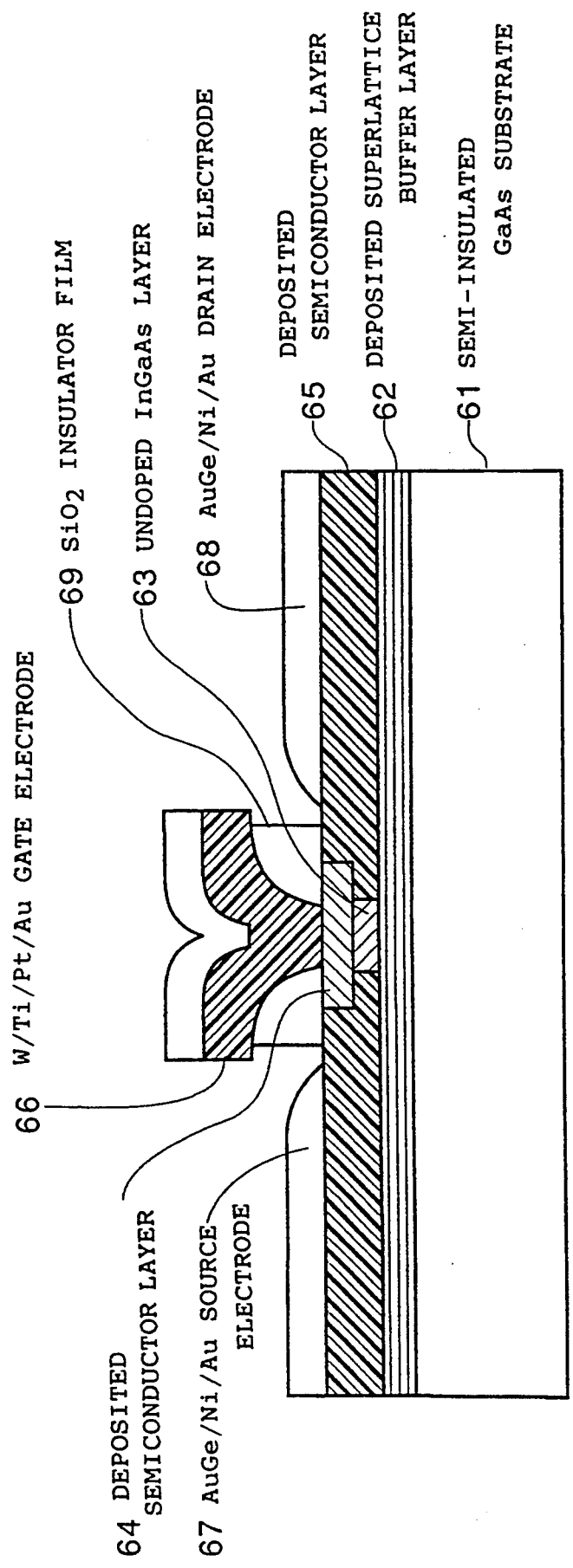
FIG. 8 is a cross sectional view showing a FET in a fourth embodiment according to the invention.

A FET of a fourth embodiment according to the invention will be described below. Referring to FIG. 8, the FET comprises a semi-insulated GaAs substrate 61, a semiconductor layer 62 having a thickness of 600 nm deposited a superlattice buffer layer comprising an undoped GaAs layer having a thickness of approximately 5 nm and an undoped AlGaAs layer having a thickness of approximately 10 nm, an undoped InGaAs layer 63 having a thickness of 15 nm, a deposited semiconductor layer 64 formed by an n-type GaAs layer having a thickness of approximately 30 nm and an impurity concentration of approximately $3 \times 10^{18}$ cm$^{-3}$ and an undoped AlGaAs layer having a thickness of approximately 20 nm, a deposited semiconductor layer 65 formed by an n-type GaAs layer having a thickness of approximately 50 nm and an impurity concentration of approximately of $4 \times 10^{18}$ cm$^{-3}$ and an n-type InGaAs layer having thickness of approximately 50 nm and an impurity concentration of approximately $6 \times 10^{18}$ cm$^{-3}$, a gate electrode 66 comprising W/Ti/Pt/Au formed on the deposited semiconductor layer 64, source and drain electrodes 67 and 68 comprising AuGe/Ni/Au layer and an insulator film 19 made of $SiO_2$ formed to surround the lower part of the gate electrode 66.

Figure 9:
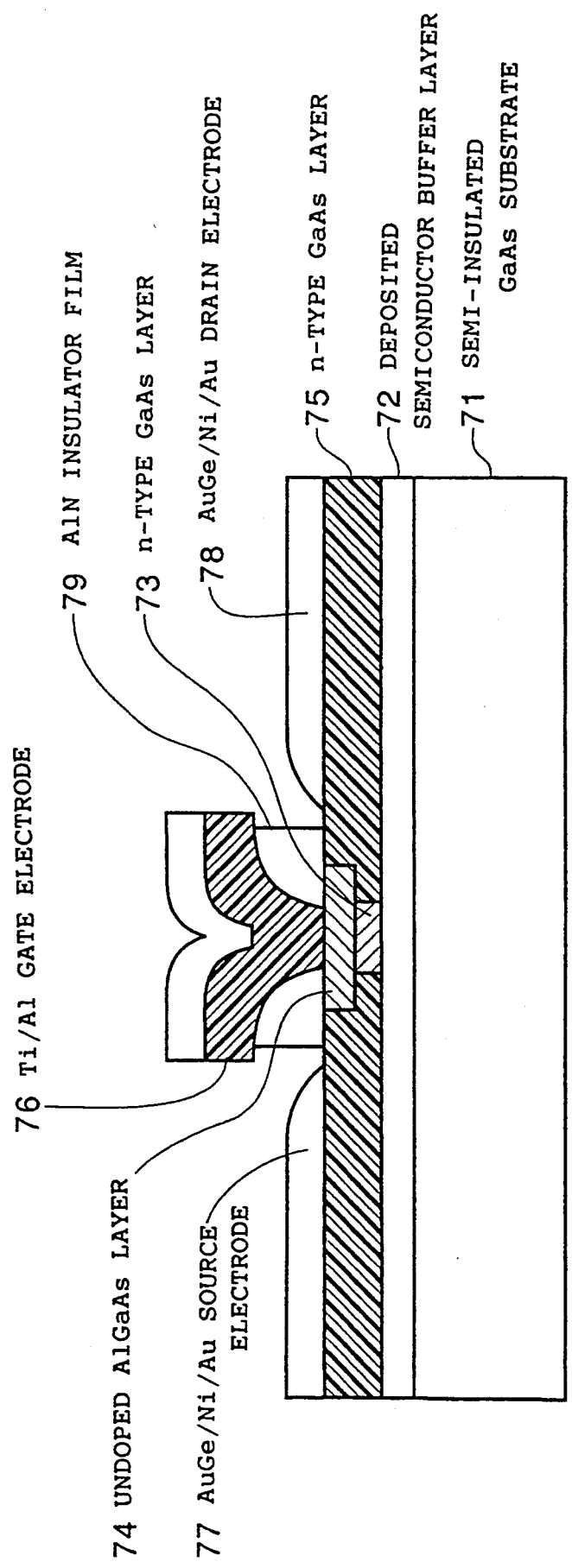
FIG. 9 is a cross sectional view showing a FET in a fifth embodiment according to the invention.

A FET of a fifth embodiment according to the invention will be described below. Referring to FIG. 9, the FET comprises a semi-insulated GaAs substrate 71, a deposited semiconductor buffer layer 72 deposited an undoped GaAs layer having a thickness of approximately 500 nm and an undoped AlGaAs layer having a thickness of approximately 100 nm formed on the substrate 71, an n-type GaAS layer 73 having a thickness of approximately 10 nm and an impurity concentration of approximately $3 \times 10^{18}$ cm$^{-3}$ formed on the buffer layer 72, an undoped AlGaAs layer 74 having a thickness of approximately 30 nm formed on the n-type GaAs layer 73, an n-type GaAs layer 75 having a thickness of 50 nm and an impurity concentration of approximately $4 \times 10^{18}$ cm$^{-3}$, a gate electrode 76 made of Ti/Al formed on the undoped AlGaAs layer 74, source and drain electrodes 77 and 78 comprising AuGe/Ni/Au layer and an insulator film 79 of AlN formed to surround a lower part of the gate electrode 76.

Figure 10:
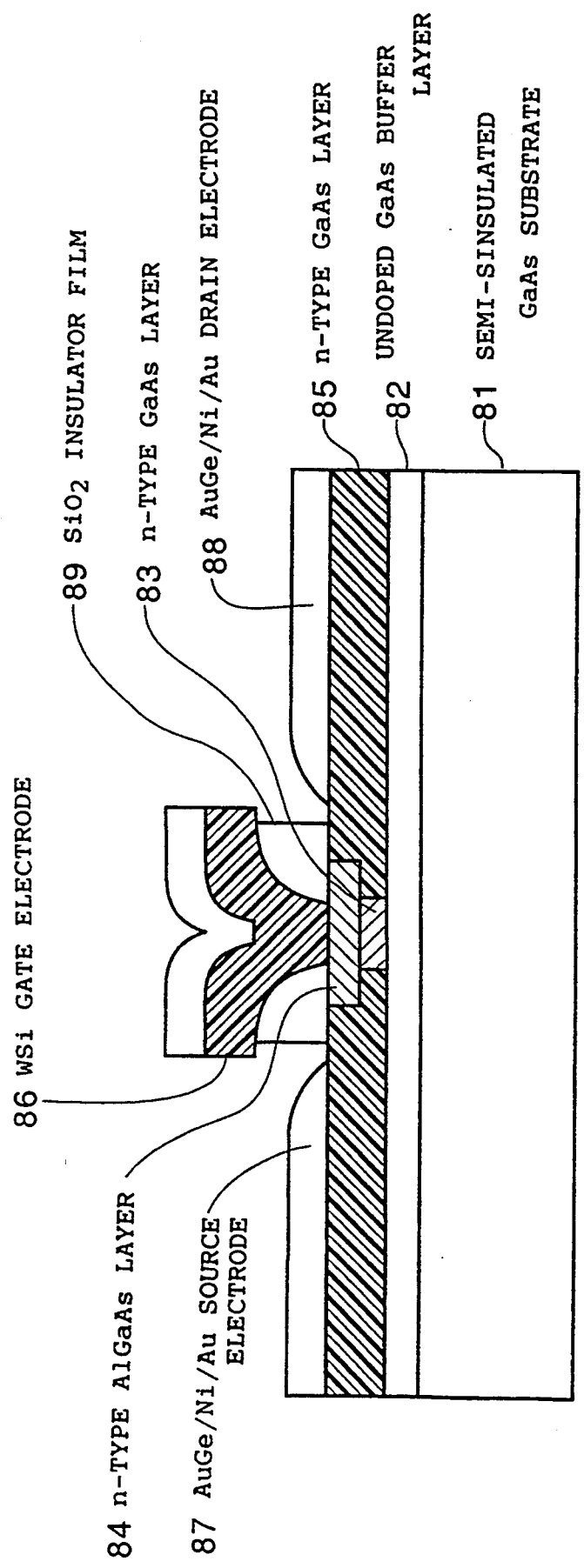
FIG. 10 is a cross sectional view showing a FET in a sixth embodiment according to the invention.

A FET of the sixth embodiment according to the invention will be described below. Referring to FIG. 10, the FET comprises a semi-insulated GaAs substrate 81, an undopad GaAs buffer layer 82 having a thickness of approximately 500 nm formed on the substrate 81, an n-type GaAS layer 83 having a thickness of approximately 30 nm and an impurity concentration of approximately $2 \times 10^{18}$ cm$^{-3}$ formed on the buffer layer 82, an n-type AlGaAs layer 84 having a thickness of approximately 40 nm and an impurity concentration of approximately $5 \times 10^{17}$ cm$^{-3}$ formed on the n-type GaAs layer 83, an n-type GaAs layer 85 having a thickness of 100 nm and an impurity concentration of approximately $4 \times 10^{18}$ cm$^{-3}$, a gate electrode 86 made of WSi formed on the n-type AlGaAs layer 84, source and drain electrodes 87 and 88 formed comprising AuGe/Ni/Au layer and an insulator film 89 of $SiO_2$ formed to surround the lower part of the gate electrode 86.

Figure 11:
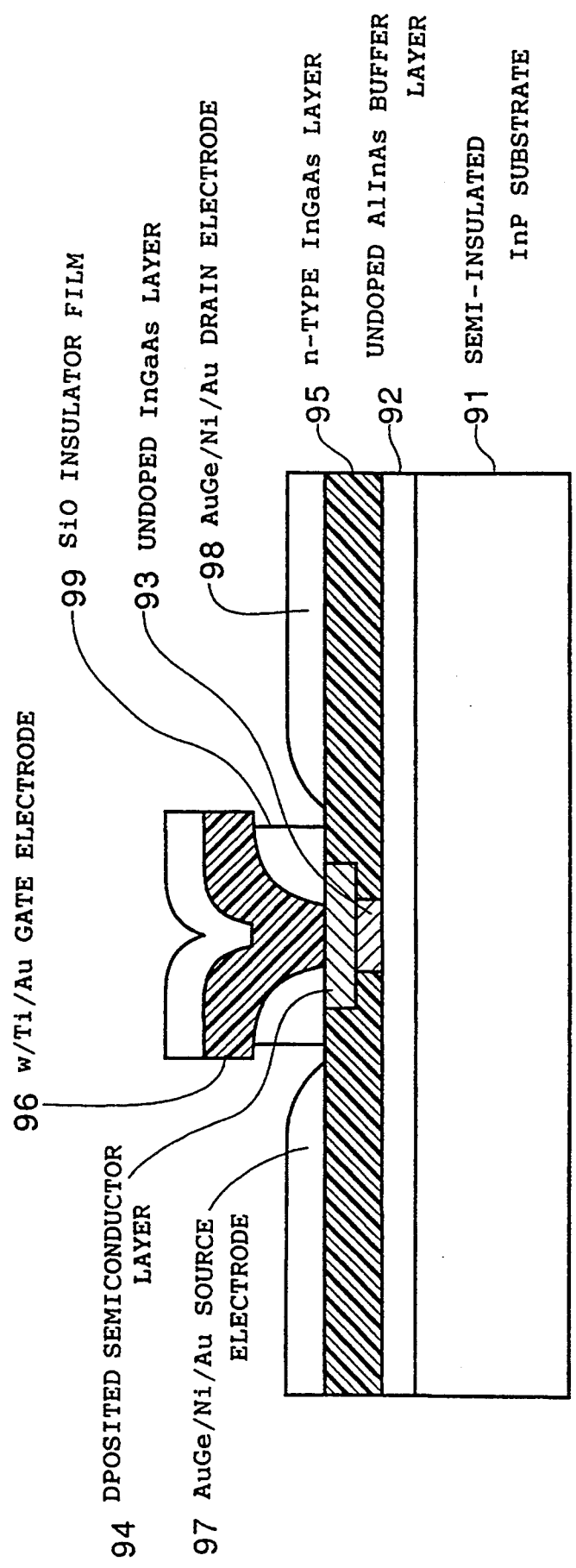
FIG. 11 is a cross sectional view showing a FET in a seventh embodiment according to the invention.

A FET of a seventh embodiment according to the invention will be described below. Referring to FIG. 11, the FET comprises a semi-insulated InP substrate 91, an undoped AlInAs buffer layer 92 having a thickness of approximately 500 nm formed on the substrate 91 an undoped InGaAS layer 93 having a thickness of approximately 50 nm formed on the buffer layer 92, a deposited semiconductor layer 94 deposited by an n-type AlInAs layer having a thickness of approximately 30 nm and an impurity concentration of approximately $3 \times 10^{18}$ cm$^{313}$, and an undoped AlInAs layer having a thickness of approximately 20 nm formed on the undoped InGaAs layer 93, an n-type InGaAs layer 95 having a thickness of approximately 50 nm and an impurity concentration of approximately $6 \times 10^{18}$ cm$^{-3}$, a gate electrode 96 comprising W/Ti/Au formed on the deposited semiconductor layer 94 source and drain electrodes 97 and 98 comprising AuGe/Ni/Au layer and an insulator film 99 of SiO formed to surround the lower part of the gate electrode 96.

Figure 12:
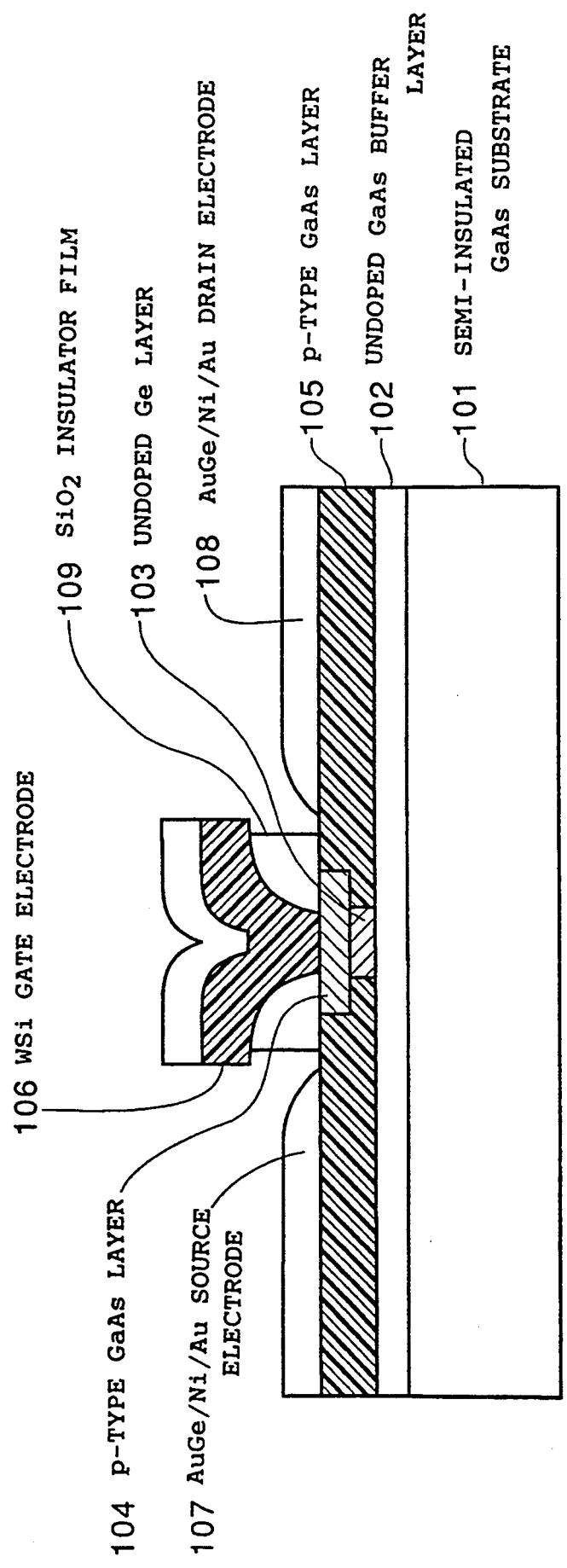
FIG. 12 is a cross sectional view showing a FET in an eighth embodiment according to the invention.

A FET of an eighth embodiment according to the invention will be described below. Referring to FIG. 12, the FET comprises a semi-insulated GaAs substrate 101, an undoped GaAs buffer layer 102 having a thickness of approximately 500 nm formed on the substrate 101, an undoped Ge layer 103 having a thickness of approximately 30 nm formed on the buffer layer 102, a p-type GaAs layer 104 having a thickness of approximately 40 nm and an impurity concentration of approximately $5 \times 10^{18}$ cm$^{-3}$ formed on the updoped Ge layer 103, a p-type GaAs layer 105 having thickness of approximately 100 nm and an impurity concentration of approximately $5 \times 10^{19}$ cm$^{-3}$, a gate electrode 106 made of WSi formed on the p-type GaAs layer 104, source and drain electrodes 107 and 108 comprising AuGe/Ni/Au layer and an insulator film 109 of SiO$_2$ formed surround the lower part of the gate electrode 106.

In the foregoing embodiments, other semiconductor materials such as InP, InAlAs, GaSb, InSb, InAs, Aisb, GaInP, etc. are available for the channel layer, the electron supply layer and the source and drain regions. Other doping methods or other doping region such as a doped monoatomic layer (δ) and other insulator films such as GaN, etc. may be available. Further, the gate electrode may include one or more semiconductor layers at its interface with a semiconductor layer. The Schottky junction may be replaced by a p-n junction, a p-i-n junction, p-i junction, n-i junction and a MIS structure (not shown in the drawings).

Whereas modifications of the present invention will no doubt be apparent to a person of ordinary skilled in the art to which the invention pertains, it is to be understood that the embodiments shown and described by way of illustration are by no means intended to be considered in a limiting sense. Accordingly, it is to be intended by the claims to cover all modifications of the invention which fall within the spirit and scope of the invention.

What is claimed is:

1. A field effect transistor comprising:
   a semiconductor substrate;
   a first layer made of a semiconductor having an electron affinity and said first layer being formed on said semiconductor substrate;
   a second layer made of material having electron affinity smaller than that of said first layer formed on said first layer, a length of said second layer being longer than that of said first layer;
   source and drain regions formed on said semiconductor substrate, said source and drain regions being separated through a lamination of said first and second layer; and
   a gate electrode formed on said second layer, a gate length of said gate electrode being shorter than that of said second layer and being shorter than that of said first layer and said gate electrode being separated from said source and drains region through said second layer.

2. A field effect transistor according to claim 1, wherein said second layer comprises a semiconductor material.

3. A field effect transistor according to claim 1, wherein said source and drain regions are respectively provided with ohmic contacts.

4. A field effect transistor according to claim 1, wherein said gate electrode includes one or more semiconductor layers at its interface with said second layer.

* * * * *